United States Patent [19]

Souza et al.

[11] Patent Number: 5,667,659
[45] Date of Patent: Sep. 16, 1997

[54] LOW FRICTION SOLDER ELECTRODEPOSITS

[75] Inventors: Therese R. Souza, Cranston; Allen E. Molvar, Barrington, both of R.I.

[73] Assignee: Handy & Harman, North Attleboro, Mass.

[21] Appl. No.: 627,542

[22] Filed: Apr. 4, 1996

[51] Int. Cl.$^6$ .................................................. C25D 15/00
[52] U.S. Cl. .......................... 205/109; 205/254; 205/299; 205/302
[58] Field of Search ...................... 205/109, 252, 205/253, 254, 299, 302

[56] References Cited

U.S. PATENT DOCUMENTS

| | | | |
|---|---|---|---|
| 2,525,942 | 10/1950 | Proell | 204/45 |
| 4,098,654 | 7/1978 | Helle et al. | 205/109 |
| 4,565,609 | 1/1986 | Nobel et al. | 204/44.4 |
| 4,599,149 | 7/1986 | Nobel et al. | 204/44.4 |
| 4,701,244 | 10/1987 | Nobel et al. | 204/44.4 |
| 4,880,507 | 11/1989 | Toben et al. | 204/44.4 |
| 4,994,155 | 2/1991 | Toben et al. | 204/28 |
| 5,066,367 | 11/1991 | Nobel et al. | 204/44.4 |
| 5,141,702 | 8/1992 | Guenin et al. | 419/8 |

OTHER PUBLICATIONS

Bapu, G.N.K. Ramesh et al., "Electrodeposition of Nickel–Polytetrafluoroethylene (PTFE) Polymer Composites," *Plating & Surface Finishing*, 86–88 (Apr. 1995).

Bhalla, V. et al., "Friction and Wear Characteristics of Electrodeposited Copper Composites," *Plating & Surface Finishing*, 58–61 (Nov. 1995).

*Primary Examiner*—Kathryn L. Gorgos
*Assistant Examiner*—Kishor Mayekar
*Attorney, Agent, or Firm*—Pennie & Edmonds LLP

[57] ABSTRACT

The present invention relates to a solution and method for plating tin, lead, or tin-lead alloy deposits which contain a co-deposit of fluorocarbon particles to provide a lower-friction solder-type deposit which reduces insertion force and fretting corrosion in separable electronic connectors. The fluorocarbon particles have a size between about 0.1 to 1 μm in diameter, and reduce the coefficient of friction of the resultant deposit to 0.8 or less. Also, the deposit has excellent mechanical properties and can be successfully soldered.

3 Claims, No Drawings

LOW FRICTION SOLDER ELECTRODEPOSITS

FIELD OF THE INVENTION

The present invention relates to a solution and method for plating tin, lead, or tin-lead alloys which contain a co-deposit of polytetrafluoroethylene ("PTFE") or another fluorocarbon to provide a lower-friction coating which reduces insertion force and fretting corrosion in separable electronic connectors.

BACKGROUND OF THE INVENTION

The traditional method for plating tin-lead alloys, commonly called Solder Plate, is to have these two metals present in solution as fluoborates with an excess of fluoboric acid and boric acid. It is common to add various types of proteins, such as peptones, glue, gelatin, or meat proteins to obtain smoother deposits. The fluoborate-based bath containing peptone is most commonly used and is commercially successful in obtaining smooth matte deposits. Brighter tin-lead solder deposits can be obtained from these fluoborate-based baths by adding various brightening agents, such as aromatic alkane pyridine compounds, ethylene oxide wetting agents and formaldehyde.

Alkane or alkyl sulfonic acids containing 1 to 5 carbon atoms have also been used in electroplating solutions. One early example is U.S. Pat. No. 2,525,942 to Proell. Several more recent patents describe the use of various additives to improve the brightness of deposits, the useful current density ranges, and/or the solderability of the deposits and to improve the performance of the electroplating bath. Examples are U.S. Pat. Nos. 4,565,609, 4,701,244, and 5,066,367, all to Nobel et al.

Low-friction coatings have been suggested for use in electronic connectors. For example, an article by G. N. K. Ramesh Bapu, et al. ("Bapu"), entitled "Electrodeposition of Nickel-Polytetrafluoroethylene (PTFE) Polymer Composites," discloses use of a nickel-PTFE composite. The Bapu composites were obtained using a Watts nickel bath containing 25 ml/L PTFE suspension. The volume percent of PTFE in the composite increased with PTFE concentration in the bath and the current density, and resulted in an adherent, smooth, uniform and semi-bright deposit when the bath was operated at 6.0 A/dm$^2$ at a pH of 3 and 50° C.

An article by V. Bhalla et al. ("Bhalla"), entitled "Friction and Wear Characteristics of Electrodeposited Copper Composites," discloses low friction where PTFE particles are dispersoids in copper composite coatings. Bhalla found that, although the Cu-PTFE composite showed the lowest wear index, at best the Cu-PTFE had a higher coefficient of friction than copper-graphite when deposited at 2 A/dm$^2$ and 30° C. This reference concludes that a copper-graphite composite was the best self-lubricating coating of those tested.

However, conventional tin, lead, and tin-lead alloys are a favored electrofinish for corrosion protection of electronic connectors, including the crimp and contact portions of the connectors. The main problem with these conventional electroplating materials is that the coefficient of friction for tin, lead, and tin-lead alloys is typically greater than 0.8.

The high coefficient of friction seen in these conventional tin or lead alloys results in a high insertion force required to connect separable connectors, as well as fretting corrosion of the connectors. This high insertion force requires larger and bulkier connectors to be manufactured, thereby increasing the size of electronic components. The high insertion force also leads to high rates of breakage when assembling connectors. Thus, electroplating materials having a reduced coefficient of friction would be desirable to provide a reduced insertion force when assembling connectors. This would advantageously permit further miniaturization of electronic components using reduced friction connectors, and would minimize fretting corrosion of separable connectors.

SUMMARY OF THE INVENTION

The present invention includes a solution for plating a low friction tin, lead, or tin-lead deposit having an alkane sulfonic acid sufficient to impart a pH below about 2 to the solution, at least one of a solution soluble tin compound or solution soluble lead compound in an amount sufficient to deposit tin or lead metal, a surfactant in an amount sufficient to assist in depositing a smooth, adherent, uniform deposit, and fluorocarbon particles in an amount sufficient to co-deposit with the tin or lead metal to form a deposit having decreased friction properties compared to deposits that do not contain such particles. In one embodiment of the invention, the sulfonic acid is methane, ethane, or propane sulfonic acid.

The solution may further include an antioxidant in an amount sufficient to reduce the formation of metal oxide sludge. In a preferred embodiment, the antioxidant is a hydroxy phenyl compound.

In a preferred embodiment of the invention, the fluorocarbon particles are about 0.1 to 1 μm in diameter. In a most preferred embodiment of the invention, the fluorocarbon resin particles comprise polytetrafluoroethylene and are present in an amount sufficient to reduce the coefficient of friction of the resultant deposit to about 0.02 to 0.8.

In a preferred embodiment of the present invention, the alkane sulfonic acid is present in an amount of between about 2 to 40 percent by volume, the tin or lead compounds are present in a total amount of about 1 to 200 g/l, the surfactant is a non-ionic surfactant and is present in an amount of between about 0.3 and 25 g/l, and the fluorocarbon particles are added in an amount of about 1 to 30 percent by volume of the solution.

The invention further includes a method for providing a substrate with a deposit having a low coefficient of friction which involves immersing the substrate into the solution described above and electroplating a low-friction tin, lead or tin-lead alloy deposit thereon.

The invention also includes a plated article having a substrate and deposit which includes a metal of tin, lead or tin-lead alloy and a co-deposit which includes fluorocarbon particles dispersed throughout the metal so that the deposit has a low coefficient of friction.

The invention further includes a method for reducing the force necessary for assembling separable electronic components which comprises providing mating surfaces of the components with a tin, lead, or tin-lead deposit that contains a co-deposit of fluorocarbon particles distributed therein to reduce the coefficient of friction of the deposit and the force necessary to join the components. In a preferred embodiment of the present invention, the method for reducing the force necessary for assembling separable electronic components which comprises providing mating surfaces of the components with a tin, lead, or tin-lead deposit that contains a co-deposit of fluorocarbon particles distributed therein to reduce the coefficient of friction of the deposit and the force necessary to join the components, wherein the tin, lead, or tin-lead deposit is produced by the method of providing a substrate with a deposit having a low coefficient of friction which involves immersing the substrate into the solution described above and electroplating a low-friction tin, lead or tin-lead alloy deposit thereon.

DETAILED DESCRIPTION OF THE INVENTION

The present invention includes a plating bath as well as a plating method for providing tin, lead, and tin-lead alloy electrodeposits having a reduced coefficient of friction as low as about 0.02 to 0.8, more preferably about 0.04 to 0.45, and most preferably about 0.06 to 0.25. Other benefits of the present invention include reduction in the insertion force required when attaching electronic connectors and reduction in fretting corrosion of the separable connectors.

The present invention advantageously reduces the coefficient of friction below that of conventional solder electrodeposits by immersing a substrate in an electroplating solution that is prepared from a mixture of alkane sulfonic acid, tin or lead, a non-ionic surfactant, an antioxidant, and a PTFE suspension. The alkane sulfonic acid typically includes any of the lower alkanes, but is preferably methane, ethane, or propane sulfonic acid with sulfonic acid being most preferred due to cost and availability considerations. The solution is highly acidic, having a pH of less than 2, and most preferably less than about 1.

The tin and/or lead metals can be added to the acid in the form of a metal or alloy which will react with the acid to form a metal sulfonate salt. Also, tin or lead can be added to the basis solution of alkylsulfohic acid and water in the form of a solution soluble compound, such as a divalent metal salt. While any one of a wide variety of salts may be used, such as tin chloride, it is highly advantageous to add the metals to the solution in the form of metal sulfonate salts which have been previously prepared. This feature is well known in the electroplating art. Also, one of ordinary skill in the art would know the amount of metal salt(s) to add to obtain the resultant deposit of tin, lead, or tin-lead alloy.

The use of tin over other metals is preferred due its low cost, corrosion inhibition properties, low contact resistance, and conventional use in solder materials. For example, nickel has poor (i.e.,high) contact resistance and copper corrodes easily. Tin used in solder materials alone, however, may produce whisker formations after lengthy time periods and under certain temperature and humidity conditions. Thus, it is preferred to use lead in a tin-lead alloy, as this inhibits the whisker formation that occurs in tin alone.

The alkane sulfonic acid of the basis solution advantageously represents about 2 to 40 percent, more preferably about 5 to 35 percent, and most preferably about 8 to 30 percent by volume. The tin as tin methanesulfonate is typically added in an amount between about 1 to 150 g/l, more preferably about 30 to 130 g/l, most preferably about 60 to 110 g/l. The lead as lead methanesulfonate is added in an amount between about 0 to 100 g/l, more preferably about 3 to 80 g/l, and most preferably about 6 to 60 g/l. Depending upon the desired electrodeposit, tin alone, lead alone, or combinations thereof may be used.

The preferred non-ionic surfactant, or wetting agent, preferably is one which does not foam or which generates very low amounts of foam. Typically, a mixture of surfactants can be used, but the specific mixture is not essential to the invention. For example, any of the surfactants described in U.S. Pat. Nos. 4,880,507 and 4,994,155 can be used. The surfactant is present in an amount between about 0.3 to 25 g/l, more preferably about 0.4 to 16 g/l, and most preferably about 0.5 to 10 g/l. In a preferred embodiment, MAFIL® SF19 and MACOL® 300 surfactants are combined. Both of these surfactants are available from PPG in Pittsburgh, Pa.

A variety of common antioxidants may be used, but the hydroxy-phenyl compounds are preferred. Specifically advantageous compounds include pyrocatechol, hydroquinone, resorcinol, phloroglucinol, pyrogallol, 3-amino phenol, hydroquinone sulfuric acid ester, catechol, and the like, as disclosed in U.S. Pat. Nos. 5,066,376 and 5,094,726. A dihydroxy substituted benzene, such as hydroquinone, resorcinol, or catechol is more preferably used. The most preferred antioxidant is hydroquinone. The antioxidant is added in an amount between about 0.2 to 2 g/l, more preferably 0.5 to 1.8 g/l, and most preferably 0.8 to 1.6 g/l. These antioxidants assist in reducing the formation of tetravalent tin, and the resulting tin oxide sludge that retards the oxidation of tin, by combining with the metal sulfonic acid. This typically enhances the plating speed, as long as the antioxidants are not present in so great an amount as to precipitate or adversely affect solubility of other plating bath components.

The electroplating bath also contains fluorocarbon particles for co-deposition with the metal or metals. Although any fluorocarbon resin particles may be used, it is advantageous to use PTFE particulate resins of about 0.1 to 1 µm in diameter, more preferably about 0.12 to 0.5 µm in diameter, and most preferably about 0.15 to 0.25 µm in diameter. In a most preferred embodiment, the PTFE used is TEFLON® TE3667-N in a 60% aqueous solution. The PTFE solution is added in an amount between about 1 to 50 volume percent, more preferably 2 to 35 volume percent, and most preferably 3 to 20 volume percent. Thus, the amount of particles can be between about 0.5 to 30 percent by volume of the solution. Other fluorocarbon particles of similar particle sizes may be used, if desired. For convenience, the term "PTFE" is generically used herein to refer to any of these suitable particles or resin particles.

The plating solution of the present invention may be prepared according to the following method. Each ingredient, including the alkane sulfonic acid, tin acid salt, lead acid salt, surfactant mixture, antioxidant, and PTFE solution, are simply added to an aqueous solution in any order desired. In a preferred embodiment, the plating bath is prepared by placing tin, lead, or tin-lead alloy sulfonic acid salt in an excess of the alkyl sulfonic acid, adjusting the acid content to the required pH, adding PTFE particles, adding surfactant and antioxidant, removing any undissolved matter by filtration, and then diluting with water to the final desired volume. Although not essential to the electroplating process, agitation is preferred to uniformly distribute the PTFE particles in the solution as well as to increase the electroplating speed.

The solution is plated using a cathodic current density of about 5 to 500 ASF (amps/ft$^2$), more preferably about 20 to 350 ASF, and most preferably about 40 to 200 ASF, to produce a smooth adherent deposit. Any suitable substrate can be used, but typically these are metals such as copper or iron containing alloys, such as copper, brass, bronze, steel, stainless steel, etc. Plating occurs at about 20° C. to 40° C., more preferably about 22°C. to 35° C., and most preferably about 24° C. to 30° C. This yields a tin-lead/PTFE deposit of about 50 to 400µ inches, more preferably about 75 to 300µ inches, and most preferably about 100 to 200µ inches. One of ordinary skill in the art can operate within these conditions to achieve the desired deposit thickness without undue experimentation.

The deposit, or coating, has a low contact resistance as measured per MIL-STD-1344A Method 3002.1, even after 4,000 hours at 115° C. and 50 g Normal force. The deposit is ductile, resists fracturing and breaking during a 90 degree bend test, and, as seen in the Examples below, has a reduced coefficient of friction of between about 0.04 to 0.8 using a 400 g load. The deposit is solderable per MIL-STD-883D Method 2003.7. Furthermore, the deposit has increased wear resistance compared to the prior art deposits as measured by a decrease in wear index and increase in the number of cycles to failure. Additionally, the fretting corrosion was reduced in the present invention.

The above improved characteristics advantageously provide the invention with increased life for tin connectors, increased reliability for tin connectors, reduced factory defects during connector assembly as a result of the reduced insertion force, and a reduction in crimp formation defects. The resulting connectors may be used for the same applications and in the same manner as conventionally electroplated tin, lead, and tin-lead alloys.

It will be understood that generally recognized good engineering and chemistry practice will be observed during the selection of proper components for the solution without departing from the present invention.

EXAMPLES

Examples 1–3

Three plating formulations were prepared according to the method disclosed above in the amounts shown in Table 1. The resulting deposits were then subjected to friction and wear testing, the results of which are shown in Table 1.

TABLE 1

Specific Compositions and Conditions of Plating

| COMPONENTS | EXAMPLE 1 | EXAMPLE 2 | EXAMPLE 3 |
|---|---|---|---|
| 70% Methanesulfonic Acid | 10% by volume | 10% by volume | 10% by volume |
| Tin as Tin Methanesulfonate | 105 g/l | 105 g/l | 105 g/l |
| Lead as Lead Methanesulfonate | 7.5 g/l | 7.5 g/l | 7.5 g/l |
| Hydroquinone | 0.5 g/l | 0.5 g/l | 0.5 g/l |
| MAFIL ® SF19 | 1 g/l | 1 g/l | 1 g/l |
| MACOL ® 300 | 0.5 g/l | 0.5 g/l | 0.5 g/l |
| TEFLON ® TE3667-N | None | 45 g/l | 90 g/l |
| Temperature (°C.) | 25 | 28 | 30 |
| Agitation (cm/s) (Liquid flow) | 150 | 150 | 150 |
| Current Density (ASF) | 50 | 50 | 50 |
| Deposit Thickness (μ inches) | 150 | 150 | 150 |
| Coeff. of Friction vs. Load (100 grams Normal Force) @ 5 cycles of 1 cm track, 0.5 cm/sec | 0.75 | 0.07 | 0.06 |
| Coeff. of Friction vs. Load (400 grams Normal Force) @ 5 cycles of 1 cm track, 0.5 cm/sec | 0.37 | Not Tested | 0.06 |
| Cycles to Failure (400 grams Normal Force) on 1 cm track, 0.5 cm/sec | 30 | Not Tested | 155 |

[1]Surfactant tradename available from PPG of Pittsburgh, PA.
[2]Surfactant tradename available from PPG of Pittsburgh, PA.
[3]Fluoropolymer resin from DuPont Corp. of Wilmington, DE.

Examples 1–3 illustrate the performance of electroplated PTFE/tin-lead deposits on electrical connectors. It is seen that by increasing the plating temperature and the amount of PTFE present in solution, the resulting coefficient of friction is greatly reduced and the number of cycles to failure (i.e., wear data) is greatly increased. The smallest coefficient of friction and greatest number of cycles to failure are desired for optimum performance of the PTFE/tin-lead electrodeposit of the present invention.

Examples 4–5

The contact resistance of a plated substrate according to the present invention was tested by preparing two samples using the plating formulation of Example 3 above. Example 4 tested the contact resistance of a 120μ inch plating layer according to the present invention on a 425 Brass substrate. Example 5 tested the contact resistance of a 120μ inch plating layer according to the present invention on a 80μ inch nickel layer on a 425 Brass substrate.

TABLE 2

Low-Signal Level Contact Resistance with Standard Deviation v. Thermal Aging Exposure Data

| Thermal Exposure at 115° C. (hrs) | Ex. 4: 120 μin. PTFE-tin plating/425 Brass (milliohms) | Ex. 5: 120 μin. PTFE-tin plating/80 μin. nickel/425 Brass (milliohms) |
|---|---|---|
| 0 | 1.97 ± 0.42 | 2.23 ± 0.68 |
| 1,000 | 1.82 ± 0.62 | 2.54 ± 0.87 |
| 4,000 | 1.16 ± 0.19 | 1.87 ± 0.48 |

The results show that the PTFE-containing deposits unexpectedly have good contact resistance, even though the deposit contains PTFE which is considered to be a dielectric material.

Although preferred embodiments of the invention have been described in the foregoing Detailed Description of the Invention, it will be understood that the invention is not limited to the embodiments disclosed but is capable of numerous modifications without departing from the spirit and scope of the present invention. It will be understood that the chemical details may be slightly different or modified by one of ordinary skill in the art without departing from the methods and solution disclosed and taught by the present invention.

What is claimed is:

1. A method for providing a substrate with a deposit having a reduced coefficient of friction which comprises:.

immersing the substrate into a solution comprising an alkane sulfonic acid in an amount sufficient to impart a pH below about 2 to the solution; at least one of a solution soluble tin compound or solution soluble lead compound in an amount sufficient to deposit tin metal, lead metal or both; a substantially non-foaming, non-ionic surfactant in an amount sufficient to assist in depositing a smooth, adherent, uniform deposit; and fluorocarbon particles having a diameter of about 0.1 μm to less than 0.5 μm; and electroplating thereon a reduced-friction tin, lead or tin-lead alloy deposit having a contact resistance that does not exceed about 3.5 milliohms over at least about 4,000 cycles.

2. The method of claim 1, wherein the deposit has a thickness of about 50 to 400μ inches.

3. A method for assembling separable electronic components with a reduced assembly force which comprises providing mating surfaces of the components with a tin, lead, or tin-lead deposit having a coefficient of friction that contains a co-deposit of fluorocarbon particles distributed therein to reduce the coefficient of friction of the deposit and the force necessary to join the components, wherein the tin, lead, or tin-lead deposit is produced by the method of claim 1.

* * * * *